United States Patent [19]

Sauer

[11] Patent Number: 4,503,550
[45] Date of Patent: Mar. 5, 1985

[54] DYNAMIC CCD INPUT SOURCE PULSE GENERATING CIRCUIT

[75] Inventor: Donald J. Sauer, Plainsboro, N.J.

[73] Assignee: RCA Corporation, New York, N.Y.

[21] Appl. No.: 394,313

[22] Filed: Jul. 1, 1982

[51] Int. Cl.³ .................... H03K 17/10; H03K 17/693
[52] U.S. Cl. ..................................... 377/63; 307/246;
307/269; 307/481; 307/453; 377/105
[58] Field of Search ............... 307/443, 444, 448, 453,
307/481, 246, 574, 577, 581–584, 264, 269, 607;
377/60, 105, 111, 62, 63

[56] References Cited

U.S. PATENT DOCUMENTS

| | | | |
|---|---|---|---|
| 3,648,181 | 3/1972 | Flore et al. | 328/59 |
| 4,035,782 | 7/1977 | Goser | 307/444 |
| 4,048,525 | 9/1977 | Goldberg et al. | 307/607 X |
| 4,137,464 | 1/1979 | Heller et al. | 377/60 X |
| 4,165,541 | 8/1979 | Varshney et al. | 377/105 X |
| 4,191,896 | 3/1980 | Sauer et al. | 307/297 |
| 4,194,133 | 3/1980 | Shannon | 377/60 |
| 4,424,456 | 1/1984 | Shiraki et al. | 307/246 X |

OTHER PUBLICATIONS

"C-MOS Makes Voltage Converter a Paragon of Efficiency" by David Bingham, dated Sep. 11, 1980, Electronics, pp. 141–146.

Primary Examiner—John S. Heyman
Assistant Examiner—David R. Hudspeth
Attorney, Agent, or Firm—Eugene M. Whitacre; Peter M. Emanuel; Lawrence C. Edelman

[57] ABSTRACT

A pulse generator circuit for applying a pulse signal to the input source electrode of a charge coupled device (CCD) having a "fill and spill" input operation, includes a voltage reference circuit for generating the "fill" voltage level of the pulse signal and a capacitive element circuit for boosting the voltage level of the pulse signal to a "spill" voltage level which exceeds the operating potential applied to the pulse generating circuit. With this type of pulse generating circuit the operating potential applied to the CCD and its support circuitry (including the pulse generator circuit) can be reduced in order to lower system power consumption while ensuring proper "spill" operation.

9 Claims, 6 Drawing Figures

DYNAMIC CCD INPUT SOURCE PULSE GENERATING CIRCUIT

The present application relates to charge coupled device (CCD) input circuits, and particularly to those of the "fill and spill" type.

U.S. Pat. No. 3,986,198 issued Oct. 12, 1976 to Walter F. Kosonocky describes a "fill and spill" mode of operation for introducing a charge signal into a CCD register. During the "fill" portion of the cycle a negative going pulse is applied to a source region to introduce a charge into a potential well region. Then, during a "spill" portion of the cycle, the potential well is partially emptied, by applying a positive-going pulse to the source region thus operating the source region as a drain. An input signal potential is established between a storage electrode under which the potential well is formed and a gate electrode between the storage electrode and the source region. The charge which remains in the potential well after the spill portion of the cycle is a function of the amplitude of this signal.

It is desirable to reduce the power consumption of the CCD register and the accompaning support circuitry by operating these circuits at a relatively low operating voltage. However, a low operating voltage level may not be of sufficient magnitude to enable the source region to be pulsed with a voltage of sufficient magnitude to allow charge to flow through the substrate region under the gate electrode on its way back to the source region during the spill operation. For proper spill operation, the source region must have a pulse of sufficient amplitude to overcome the channel potential of the substrate region under the gate electrode. Unfortunately, that channel potential cannot be accurately predicted due to variations in various process parameters which occur during device fabrication.

Thus, it is desirable to provide a source region pulse generator for a CCD register which will ensure proper operation under low operating voltage conditions.

The present invention concerns a pulse source which supplies to the source electrode of a CCD a first voltage level sufficient for causing a transfer of charge from the source region to fill a potential well region during a first time period and, a second voltage level sufficient for causing a transfer of charge from the potential well region to the source region, leaving stored in the potential well region an amount of charge dependent upon the relative potential difference between the gate and storage electrodes during a second time period. Specifically, in accordance with a feature of the present invention, a first capacitive element is coupled to the source electrode and means are provided for establishing the first voltage level across the first capacitive element during the first time period. A second capacitive element is coupled to the first capacitive element and means are provided for changing the charge of the second capacitive element at the beginning of the second time period for transferring charge between the first and second capacitive elements to thereby change the voltage level developed across the first capacitive element from the first voltage level to the second voltage level. Because of the capacitive transfer, the second voltage can be higher than that of the supply voltage of the pulse generator.

Figure 1:
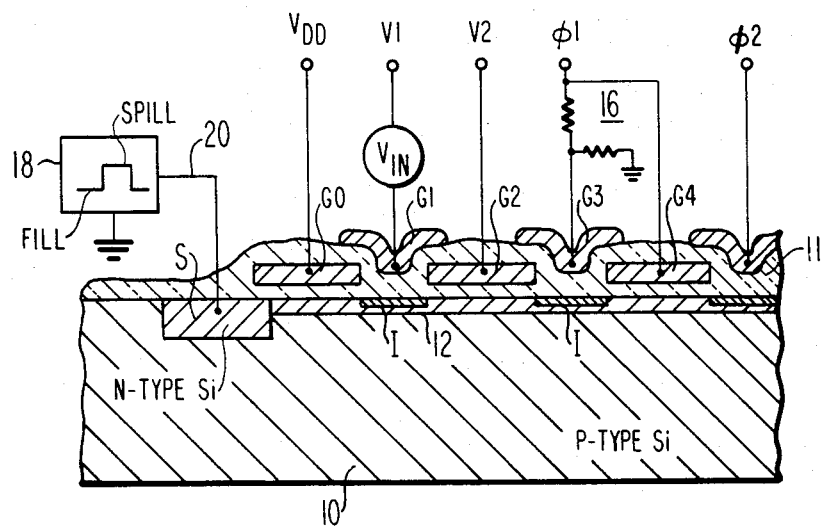
FIG. 1 is a sectional view of a known CCD input circuit.

FIG. 1 illustrates a typical CCD register employing the "fill and spill" mode of operation. It includes a P-type silicon substrate 10 having an input source region S, which may be a diffusion of opposite conductivity type to that of substrate 10, a first plurality of polysilicon electrodes such as G1 and G3, formed on an oxide layer 11 and a second plurality of polysilicon electrodes such as G0, G2 and G4 formed on oxide layer 11. A buried N-type channel 12 is formed in the substrate beneath oxide layer 11. P-type ion implants I are formed in channel 12 beneath electrodes G1, G3 and G4, for establishing dc offsets between adjacent electrodes to obtain asymmetrical potential wells in the substrate regions beneath these adjacent electrodes. This establishes unidirectional charge propagation when two-phase clock signals are applied.

Figure 2:
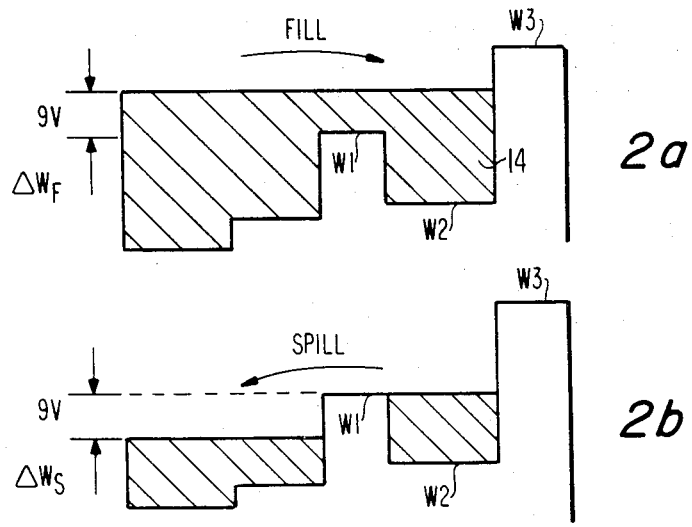
FIG. 2 is a graphic illustration of substrate potential profiles helpful in understanding the operation of FIG. 1.

Electrode G0, is held at a constant high dc voltage $V_{DD}$ (e.g., +12 volts) and acts to extend source region S in a well defined manner with respect to the remaining electrodes. A DC voltage V2 (e.g., +8 volts) is applied to storage electrode G2 to form a potential well 14 having a channel potential W2, as shown in FIG. 2, beneath storage electrode G2. A DC voltage V1 (e.g., +3 volts) is applied to gate electrode G1 to form a relatively shallow potential well (gate) having a channel potential of W1. A clock signal $\phi 1$ is applied to electrode G4. A voltage divided version of clock signal $\phi 1$, produced by a voltage divider 16, is applied to electrode G3 to form a relatively shallow potential well having a channel potential W3 which varies in response to $\phi 1$ beneath electrode G3. A signal component $V_{IN}$ is effectively applied between electrodes G1 and G2 (for example, by superimposing it through a capacitor on voltage V1 at electrode G1).

During the "fill" portion of the operation, source electrode 20 couples a negative-going pulse from generator 18 to region S which causes region S to operate as a source of charge carriers. As shown in FIG. 2a the electrons pass over the potential barrier W1 beneath electrode G1 and fill the potential well 14 beneath storage electrode G2 when the potential applied to region S creates a channel potential $W1 - \Delta W_F$. The relatively shallow potential barrier W3 prevents any of the charge signal from flowing through the CCD register. In the present example, the ion implants I under electrodes G1 and G3 establish a voltage threshold of approximately −6 volts. If $V_1$ equals +3 volts, the channel potential of barrier W1 is approximately 9 volts. For proper filling operation region S must be pulsed approximately one volt ($\Delta W_F$) relatively negative with respect to the channel potential of barrier W1 (i.e., 8 volts). A voltage threshold of approximately −10 volts is established under electrodes G0, G2 and G4 without ion implants. If V2 is +8 volts, the channel potential of barrier W2 formed under electrode G2 is approximately 18 volts.

As shown in FIG. 2b, for proper spill operation, region S must be pulsed relatively positive with respect to the channel potential of barrier W1 by an amount $\Delta W_S$ (approximately one volt) in order to act as a drain for removing excess charge carriers and leave in potential well 14 an amount of charge including a component corresponding to the signal $V_{IN}$. After the spill operation is completed, the reduced amplitude $\phi_1$ signal applied at electrode G3 "skims" off the charge component corresponding to $V_{IN}$ only, which component is subsequently propagated through the CCD channel by the $\phi_1$ and $\phi_2$ clock signals. See U.S. Pat. No. 4,158,209 issued June 12, 1979 to Peter A. Levine for more details concerning the "skimming" operation.

It is important in the operation described above that the potential of the input diffusion region S establish a channel potential at least $\Delta W_S$ greater than $W_1$ to ensure that substantially all of the excess charge carriers (electrons) pass over barrier W1 from well 14. However, when operating the CCD circuit with a low operating voltage level, the voltage level required for source S corresponding to $W_1+\Delta WS$ may exceed the available supply voltage level. The present invention relates to a pulse generator circuit for the source electrode of a CCD suitable for use as pulse circuit 18 which has provisions for ensuring proper spill operation under low supply voltage conditions. This may be a particular problem because, as previously noted, the channel potentials formed under the electrodes of a CCD, including W1, cannot be precisely predicted due to process related factors determined during device fabrication.

Figure 3:
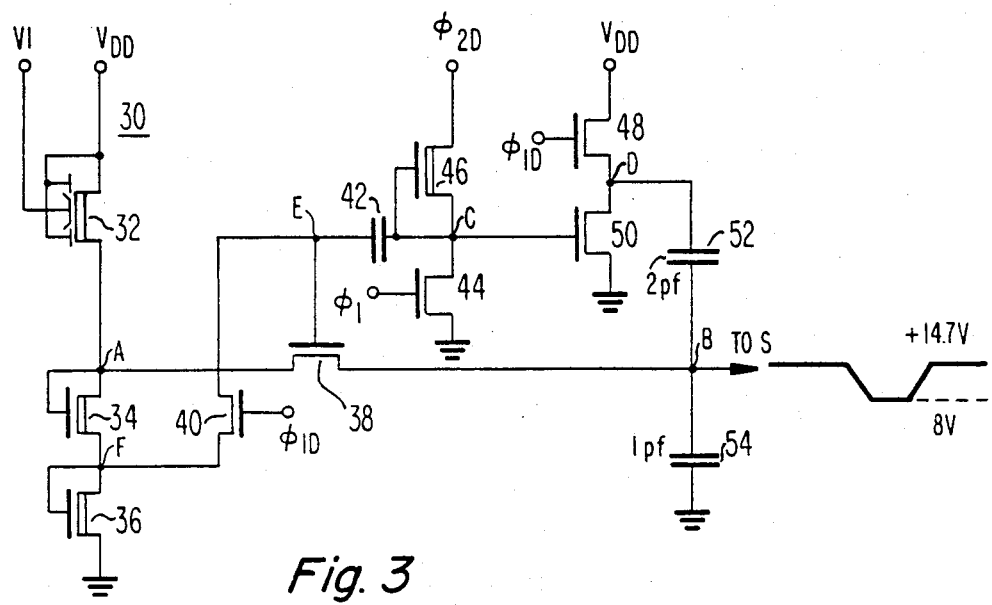
FIG. 3 is a schematic of a pulse generating circuit constructed in accordance with principles of the present invention.

A preferred embodiment of the invention is shown in FIG. 3. In the structure of FIG. 3, N-channel field-effect transistors (FETs) are utilized throughout. It includes a voltage reference source 30 comprising three depletion mode MOS FETs 32, 34 and 36 having their conduction paths coupled in series between a source of operating supply voltage $V_{DD}$ (e.g., 12 volts) and ground. FET 32 is fabricated to have electrical characteristics which match the input electrode structure of the CCD of FIG. 1. FET 32 includes three gate electrodes, two of which are coupled to its drain electrode and a third (middle electrode) which receives the V1 bias voltage. The gate electrodes of FETs 34 and 36 are connected to their respective drain electrodes.

The conduction path of an FET 38 connects a node A, which is at the junction of the drain of FET 34 and the source of FET 32, to node B, which is direct current connected to the source electrode of a CCD such as shown in FIG. 1. A FET 40 has its conduction path connected to a node F at the junction between the conduction paths of FETs 34 and 36 and the gate electrode of FET 38. A $\phi_{1D}$ clock signal is applied to the gate of FET 40. The gate of FET 38 is connected to a node C through a capacitor 42. FET 44 has its conduction path connected between node C and ground and a gate electrode coupled to receive a $\phi_1$ clock signal. Depletion mode FET 46 has its gate electrode and one end of its conduction path coupled to node C and the other end of its conduction path coupled to receive a $\phi_{2D}$ clock signal. FETs 48 and 50 have their conduction paths coupled in series between the source of operating potential $V_{DD}$ and ground. The gate electrode of FET 50 is coupled to node C and the gate electrode of FET 48 is coupled to receive the $\phi_{1D}$ clock signal. A node D, at the junction between the conduction paths of FETs 48 and 50, is coupled to node B through a first capacitor 52. A second capacitor 54 couples node B to ground.

Figure 4:
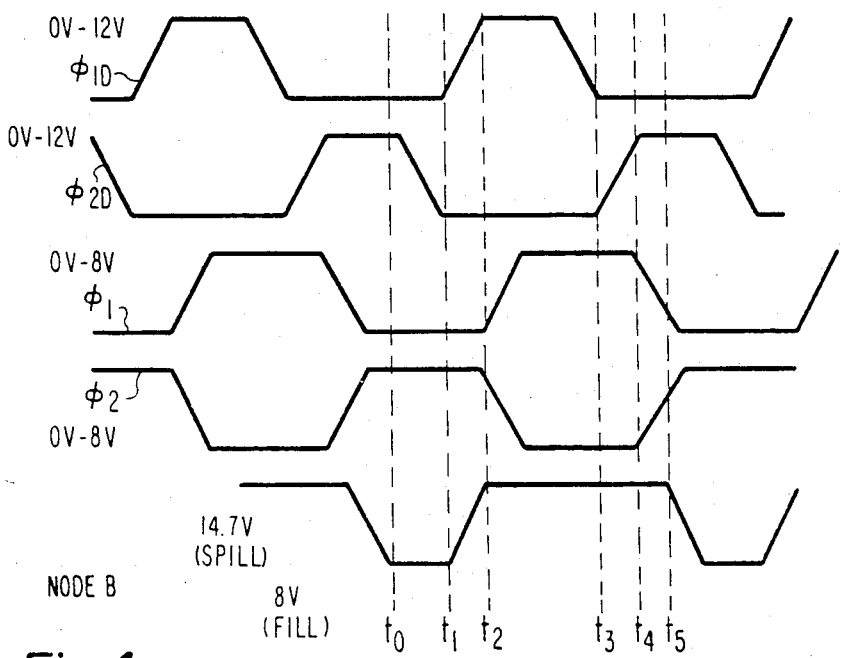
FIG. 4 is a graphic illustration of the waveforms of clock signals employed for operating the CCD of FIG. 1 and the circuit of FIG. 3.

Graphic representations of clock signals $\phi_1$, $\phi_2$, $\phi_{1D}$ and $\phi_{2D}$ are shown in FIG. 4. A clock generator 60 shown in FIG. 5 to be described later on, generates the $\phi_1$, $\phi_2$, $\phi_{1D}$ and $\phi_{2D}$ clock signals shown in FIG. 4 which operate the CCD of FIG. 1 and the circuit of FIG. 3.

In operation, voltage reference source 30 provides a voltage at node A which properly biases source region S during the fill portion of the cycle. As previously noted FET 32 is biased and fabricated to match the electrical characteristics of the input gate structure of the CCD. Thus, at conduction, the voltage established at its source electrode (node A) is 9 volts (the potential of W1 in FIG. 2). However, resistor connected depletion mode FETs 34 and 36 cause an amount of current to be drawn through FET 32 which lowers the voltage at node A to approximately 8 volts (i.e., W1 less $\Delta W_F$) which is sufficient for the fill operation. FET voltage divider 34, 36 establishes +4 volts at node F.

Referring to FIGS. 3 and 4, at time $t_0$ depletion mode FET 46 couples the high level of the $\phi_{2D}$ signal to node C. This high voltage level is AC coupled via capacitor 42 onto the gate of FET 38 and is sufficient to turn on FET 38. When FET 38 is conductive, the +8 volts developed at node A is coupled to node B charging capacitor 54 to +8 volts. Thus the source region is biased to allow proper fill operation. Additionally, it is noted that before the increasing voltage at node C has caused FET 38 to conduct, it causes FET 50 to conduct. The purpose of FET 50 will be described later.

At time $t_1$ depletion mode FET 46 couples a low level $\phi_{2D}$ signal to node C which causes FET 50 to become nonconductive and lowers the voltage level at node E (via capacitor 42) a voltage level sufficient to cause FET 38 to become nonconductive. Thus, node B is isolated from node A and floats at +8 volts. Immediately after time $t_1$, the $\phi_{1D}$ clock signal begins to increase. When $\phi_{1D}$ reaches the turn-on threshold voltage for FET 48 (approximately 1 volt), FET 48 becomes conductive and the voltage at node D increases. Serially connected capacitors 52 and 54 operate as a transient signal voltage divider and have capacitances selected to provide at node B a transient voltage corresponding to two-thirds the voltage change at node D which is superimposed on the voltage stored at node B.

By time $t_2$ the $\phi_{1D}$ clock signal has had an amplitude excursion of +12 volts, causing node D to change by approximately +10 volts (12 volts less $V_T$) and a +6.7 volt change occurs at node B, increasing the voltage across capacitor 54 to approximately +14.7 volts. This voltage is sufficiently greater than the channel potential of barrier W1 to ensure proper spill operation of the CCD register in spite of the relatively low supply voltage $V_{DD}$ of +12 volts. Also, between time $t_1$ and $t_2$, when the $\phi_{1D}$ clock signal reaches a voltage level $V_T$ above the voltage level at node F, FET 40 is rendered conductive to clamp node E to the voltage level at node F (4 volts) and establish 4 volts across capacitor 42.

At time $t_3$, the $\phi_{1D}$ clock signal is low, which causes FET 40 to become nonconductive and node E to float.

At time $t_4$, the $\phi_{2D}$ clock signal is high, causing FET 46 to conduct current into node C. However, since the $\phi_1$ signal is also still high at $t_4$, FET 44 is conductive and the voltage at node C cannot increase.

At time $t_5$ the voltage level of the $\phi_1$ clock signal falls below the conduction threshold of FET 44, causing it to become nonconductive. Consequently, the voltage at node C begins to increase. When it reaches the turn-on threshold for FET 50 (approximately 1 volt), FET 50 becomes conductive and pulls the voltage at node D down to ground. As a result, there is a sudden −10 volt drop at node D. This drop is applied by the transient voltage division effect of capacitors 52 and 54 as a −6.7 volt transient at node B superimposed on the voltage previously stored at node B. This transient denotes the end of the spill portion of the cycle and reduces the voltage at node B from +14.7 volts back to the +8 volt level required for proper filling of the input potential well 14 of FIG. 2. After FET 50 becomes conductive, the increasing voltage at node C is coupled via capacitor 42 to node E causing FET 38 to again become conductive and clamp node B to the 8 volt reference level established at node A of reference voltage source 30.

Figure 5:
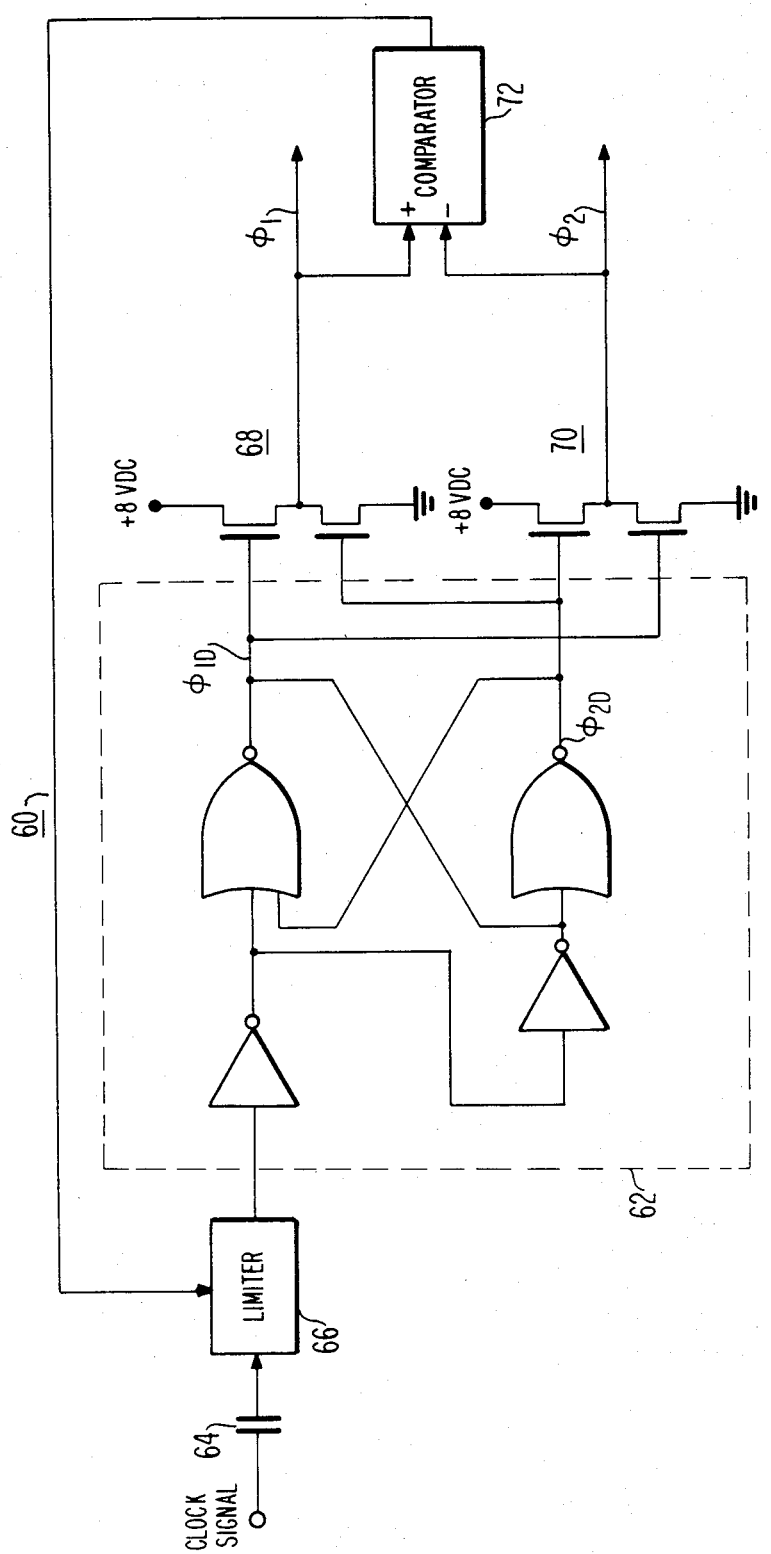
FIG. 5 is a schematic of a circuit for generating the clock signals shown in FIG. 4.

As earlier noted, the $\phi_1$, $\phi_2$, $\phi_{1D}$ and $\phi_{2D}$ clock signals illustrated in FIG. 4 are generated by the clock generator circuit 60 shown in FIG. 5. The structure of FIG. 5 includes a cross-coupled NOR gate flip-flop 62 which generates the $\phi_{1D}$ and $\phi_{2D}$ clock signals in response to a clock signal which is coupled to flip-flop 62 through a capacitor 64 and an input limiter 66. The $\phi_{1D}$ and $\phi_{2D}$ clock signals are coupled to respective inputs of a pair of push-pull circuits 68 and 70, each comprising two FETs of the same conductivity type having their conduction paths connected in series. The gates of each pair of FETs in 68 and 70 are driven in a complementary manner in responses to the $\phi_{1D}$ and $\phi_{2D}$ clock signals for generating at the junctions between the FETs of each pair the complementarily phased clock signals $\phi_1$ and $\phi_2$. The push-pull circuits 68 and 70 are powered by an 8 volt supply voltage source. The DC level of the input at limiter 66 relative to its switching threshold determines the duty cycle for the clock signals and is controlled in a negative feedback manner by a phase comparator 72 responsive to the average DC value of the $\phi_1$ and $\phi_2$ clock signals for establishing a 50% duty cycle for the $\phi_1$ and $\phi_2$ clock signals.

Thus, what has been described is a pulse generator for the source diffusion of a CCD register which generates a "fill and spill" pulse having amplitudes which ensure proper input operation in spite of (1), reduced operating voltage levels, and (2) process variations which affect the height of the potential barriers in the input region of the CCD substrate.

While the invention has been illustrated in terms of a N-type buried channel CCD employing a P-type substrate, it is to be understood that other conductivity types could be employed and that the pulse generator of the present application can also be used with other CCD structures, such as the surface channel type. Additionally, although the generator circuit of the present example is preferably fabricated on the same integrated circuit as the CCD register, it could instead be fabricated on a separate integrated circuit or be made using discrete circuit components.

What is claimed is:

1. In an input structure for a charge coupled device (CCD) which includes a semiconductor substrate, a source electrode, a source region in said substrate connected to said electrode, a storage electrode insulated from said substrate, a potential well region in said substrate under said storage electrode, and a gate electrode insulated from said substrate and located between said storage electrode and said source electrode, means for coupling a first reference voltage to said gate electrode, means for coupling a second reference voltage to said storage electrode, a signal source coupled to one of said gate and storage electrodes, and a pulse source for supplying a pulse signal having a first voltage level during a first time period for causing a transfer of charge from said source region to fill said potential well region, and a second voltage level during a second time period for causing a transfer of charge from said potential well region to said source region to leave stored in said potential well region an amount of charge dependent upon the relative potential difference between said gate and storage electrodes, the improvement wherein said pulse source comprises:

a first capacitive element coupled to said source electrode;

first means coupled to said first capacitive element for maintaining said first voltage level across said first capacitive element during said first time period;

a second capacitive element coupled to said first capacitive element; and second means including means for applying a voltage to said second capacitive element at the beginning of said second time period, which voltage is capacitively divided between said first and second capacitive elements and thereby changes the voltage level developed across said first capacitive element from said first voltage level to said second voltage level, and means for applying a voltage to said second capacitive element at the end of said second time period, which voltage is capacitively divided between said first and second capacitive elements and thereby changes the voltage level developed across said first capacitive element from said second voltage level to said first voltage level.

2. The apparatus recited in claim 1 wherein:

said first means includes a voltage source providing said first voltage level at an output; a first switching element having a first conduction path connected between said output of said voltage source and said source electrode and a first control input for controlling the conduction of said first conduction path; and means for coupling a first control signal to said first control input to render said first conduction path conductive during said first time period;

said means for applying a voltage to said second capacitive element at the beginning of said second time period includes a second switching element having a second conduction path connected between a source of a third reference voltage and said second capacitive element and a second control input for controlling the conduction of said second conduction path; and means for coupling a second control signal to said second control input to render said second conduction path conductive at the beginning of said second time period; and said means for applying a voltage to said second capacitive element at the end of said second time period includes a third switching element having a third conduction path connected between a source of a fourth reference voltage and said second capacitive element and a third control input for controlling the conduction of said third conduction path; and means for coupling a third control signal to said third control input to render said third conduction path conductive at the end of said second time period.

3. The apparatus recited in claim 2 further including:

means for generating said first, second and third control signals in the named order, in response to clock pulses.

4. The apparatus recited in claim 3 wherein:
said means for generating said first, second and third control signals includes means for generating said third control signal at a circuit node and delay means having an input coupled to said circuit node and an output for providing a delayed version of said third control signal as said first control signal, such that conduction of said first switching element is delayed until after the conduction of said third switching element.

5. The apparatus recited in claim 4 wherein:
said second and third conduction paths are connected in series between said sources of said third and fourth reference voltages;
said first and second capacitive elements are coupled in series between the junction between said second and third conduction paths and said source of said fourth reference voltage; and
said source electrode is connected to the junction between said first and second capacitive elements.

6. The apparatus recited in claim 5 wherein:
said second voltage level is of a magnitude greater than that of said third reference voltage.

7. The apparatus recited in claim 6 wherein:
said CCD device is an N-channel device;
said first, second and third switching elements are N-channel devices; and
said third reference voltage is a positive voltage.

8. The apparatus recited in claim 2 wherein:
said voltage source includes a first depletion mode MOSFET having a gate electrode coupled to said first reference voltage and first and second electrodes defining a conduction path coupled between said source of third reference voltage and said source electrode, respectively, and being configured as a source follower and having a conduction threshold level which substantially matches the potential level in the substrate region beneath said gate electrode; and
a second depletion mode MOSFET having a conduction path coupled between said second electrode of said first depletion mode MOSFET and said source of said fourth reference voltage, said output of the voltage source being provided at the junction of said first and said second depletion mode MOSFET's.

9. In an input structure for a charge coupled device (CCD) which includes a semiconductor substrate, a source electrode, a source region in said substrate connected to said source electrode, a storage electrode insulated from said substrate, a potential well region in said substrate under said storage electrode, a gate electrode insulated from said substrate and located between said storage electrode and said source electrode, means for coupling a first reference voltage to said gate electrode, means for coupling a second reference voltage to said storage electrode, a signal source coupled to one of said gate and storage electrodes, and a pulse source for supplying a pulse signal to said source electrode, said pulse signal having a first voltage level during a first time period for causing a transfer of charge from said source region to fill said potential well region and a second voltage level during a second time period for causing a transfer of charge from said potential well region to said source region to leave stored in said potential well region an amount of charge dependent upon the relative potential difference between said gate and storage electrodes, the improvement wherein said pulse source comprises:

first and second terminals for providing a source of operating voltage therebetween;

first and second capacitive elements serially coupled between a circuit node and said second terminal, respectively, the junction of said capacitive elements being connected to said source electrode;

a source of reference voltage;

first means responsive to a first control signal for coupling said reference voltage to said junction for maintaining at said junction said first voltage level during said first time period;

second means for coupling said circuit node to said first terminal at the beginning of said second time period, in response to a second control signal, for developing at said junction said second voltage level;

third means for coupling said circuit node to said second terminal at the end of said second time period, in response to a third control signal, for developing at said junction said first voltage level; and means for supplying said first, second and third control signals to said first, second and third means, respectively, in the named order.

* * * * *